United States Patent
Su

(10) Patent No.: US 10,236,830 B2
(45) Date of Patent: Mar. 19, 2019

(54) SIGNAL PROCESSING SYSTEM AND METHOD THEREOF

(71) Applicant: LYRA SEMICONDUCTOR INCORPORATED, Hsinchu County (TW)

(72) Inventor: Ming-Tang Su, Hsinchu County (TW)

(73) Assignee: LYRA SEMICONDUCTOR INCORPORATED, Hsinchu County (TW)

( * ) Notice: Subject to any disclaimer, the term of this patent is extended or adjusted under 35 U.S.C. 154(b) by 0 days.

(21) Appl. No.: 15/682,611

(22) Filed: Aug. 22, 2017

(65) Prior Publication Data

US 2019/0052229 A1   Feb. 14, 2019

(30) Foreign Application Priority Data

Aug. 14, 2017 (TW) .............................. 106127459 A

(51) Int. Cl.
| | |
|---|---|
| H03F 1/02 | (2006.01) |
| H03F 3/21 | (2006.01) |
| H04R 5/04 | (2006.01) |
| H03F 3/183 | (2006.01) |

(52) U.S. Cl.
CPC ........... *H03F 1/0233* (2013.01); *H03F 3/183* (2013.01); *H03F 3/21* (2013.01); *H04R 5/04* (2013.01)

(58) Field of Classification Search
None
See application file for complete search history.

(56) References Cited

U.S. PATENT DOCUMENTS

| | | | | |
|---|---|---|---|---|
| 2008/0226101 A1* | 9/2008 | Silber | .................... | H04B 1/207 381/123 |
| 2011/0007909 A1* | 1/2011 | Schuurmans | ......... | H03F 1/0238 381/74 |
| 2012/0154032 A1* | 6/2012 | Lesso | ..................... | H03F 1/304 330/109 |
| 2013/0154032 A1* | 6/2013 | O'Donnell | ............ | B81C 1/0023 257/415 |

* cited by examiner

*Primary Examiner* — Joshua Kaufman
*Assistant Examiner* — Kenny H Truong
(74) *Attorney, Agent, or Firm* — Lin & Associates Intellectual Property, Inc.

(57) ABSTRACT

A signal processing system and method is disclosed, applicable to environment providing voltage to Class-H driver. When using the signal processing system, the first is to detect the volume change of inputted voice and use the detection result as a power source to generate an expectation value for the circuit; the input end of the power generation circuit also adds a voltage offset in addition to the expectation value, so that the output voltage from the output end of the power generator provided to the Class-H driver is higher than a fixed value. The signal processing system and method of the present invention can adjust automatically and rapidly the output voltage signal for the power voltage provided to the Class-H driver by using negative feedback controller (such as, negative feedback loop, voltage offset and proportional integral differential (PID)) based on the detected volume change of inputted voice.

6 Claims, 9 Drawing Sheets

SIGNAL PROCESSING SYSTEM AND METHOD THEREOF

CROSS-REFERENCE TO RELATED APPLICATION

The present application is based on, and claims priority from, Taiwan Patent Application No. 106127459, filed Aug. 14, 2017, the disclosure of which is hereby incorporated by reference herein in its entirety.

TECHNICAL FIELD

The technical field generally relates to a signal processing system and method, and in particular, to a signal processing system and method, applicable to an environment providing voltage to Class-H driver, based on the detected volume change of inputted voice, able to adjust automatically and rapidly the output voltage signal for the power voltage provided to the Class-H driver by using negative feedback controller, able to obtain demand message before loading demand occurring.

BACKGROUND

In the known audio-driver technology, the conventional Class-AB driver uses fixed voltage power source, and shows poor efficiency in low-power output. The enhanced Class-G driver has a limited number of power stages, and a better efficiency than Class-AB driver; however, the Class-G driver is still unable to achieve optimal condition.

The power source for Class-H driver automatically adjusts the voltage supply according to the signal input. Although simple in concept, the design of power source to achieve rapid change based on loading is very difficult.

The conventional approach is to use the change in loading to adjust voltage supply; however, in a causality system, the demand comes before the supply. Thus, with drastic change in signal, the supply will be unstable.

U.S. Pat. No. 8,149,061 disclosed "Class H Amplifier", wherein the disclosure adjusts the input to the control circuit by controlling the negative output node; however, an instantaneous drastic change in loading output will leave the power source insufficient time to supply a corresponding voltage.

U.S. Pat. No. 7,863,841 disclosed "Class H Drive", wherein the approach is to use the detection of loading current to adjust the power voltage. Because the time of loading change occurs before the supply adjustment, a possible situation is that the power source may be unstable with drastic loading change.

Therefore, the issues need to be addressed include how to obtain demand message before the loading demand occurs so that an instantaneous surge in loading output will not lead to belated voltage supply, as well as free of the unstable voltage supply in case of the drastic loading change when using current loading detection as a basis for voltage adjustment.

SUMMARY

An object of the present invention is to provide a signal processing system and method, applicable to an environment providing voltage to Class-H driver, based on the detected volume change of inputted voice, able to adjust automatically and rapidly the output voltage signal for the power voltage provided to the Class-H driver by using negative feedback controller, able to obtain demand message before loading demand occurring.

Another object of the present invention is to provide a signal processing system and method, applicable to an environment providing voltage to Class-H driver, able to adjust automatically and rapidly the output voltage signal for the power voltage provided to the Class-H driver by using negative feedback controller, voltage offset, and proportion integral differential (PID) controller.

Yet another object of the present invention is to provide a signal processing system and method, applicable to an environment providing voltage to Class-H driver, able to use envelope circuit with different attach rates and release rates to detect the demand of inputted signal.

Yet another object of the present invention is to provide a signal processing system and method, applicable to an environment providing voltage to Class-H driver, able to adjust automatically and rapidly the output voltage signal for the power voltage provided to the Class-H driver by using negative feedback controller, and proportion integral differential (PID) controller, able to add an offset in the feedback loop to control a safe offset of voltage supply output and the demand, able to use direct current to direct current (DC/DC) power generator in combination with a low dropout linear regulator (LDO) to provide a high quality power driver to the Class-H driver.

Yet another object of the present invention is to provide a signal processing system and method, applicable to an environment providing voltage to Class-H driver, providing a power source circuit design for Class-H driver so that an instantaneous surge in loading output will not lead to belated voltage supply, as well as free of the unstable voltage supply in case of the drastic loading change when using current loading detection as a basis for voltage adjustment.

To achieve the aforementioned objects, the present invention provides a signal processing system, comprising at least: a volume unit (VU) meter module, and a power source generation circuit.

VU meter module: the UV meter module detects volume changes in a left sound L-in and a right sound R-in, and uses detection results as an expected value for the power source generation circuit.

Power source generation circuit: the power source generation circuit is a negative feedback circuit, and has input ends for receiving the expected value outputted from the VU meter module, a voltage offset (Voffset), and a feedback voltage (Vo) outputted from an output end of the power source generation circuit to perform voltage negative feedback processing, the output end of the power source generation circuit outputs voltages (VPP+/VPP−) higher than a fixed value, and provided to the Class-H driver.

Moreover, based on actual application, the signal processing system of the present invention can operate with a first delay module and a second delay module; wherein, the first delay module receives the left sound L-in and the second delay module receives the right sound R-in; the first delay module is a first delay circuit for the left sound L-in, and the second delay module is a second delay circuit for the right sound R-in; the first delay circuit and the second delay circuit respectively and simultaneously delay the left sound L-in and right sound R-in for a duration longer than a delay duration of the output voltage (VPP+/VPP−) from the outputted end of the power source generation circuit caused by signal processing of the VU meter module and the power source generation circuit to ensure the Class-H driver already has the output voltage (VPP+/VPP−) from the outputted end of the power source generation circuit when the left sound L-in and right sound R-in arrive at the Class-H driver; in other words, obtaining the demand message before the loading demand occurring.

When using the signal processing system to perform signal processing method, the first step is to perform sound detection; by using the VU meter module to detect volume changes in the left sound L-in and the right sound R-in, and using detection results as an expected value for the power source generation circuit.

Then, the next step is to perform signal processing: using the power source generation circuit as a negative feedback circuit, and having input ends for receiving the expected value outputted from the VU meter module, a voltage offset (Voffset), and a feedback voltage (Vo) outputted from an output end of the power source generation circuit to perform voltage negative feedback processing, the output end of the power source generation circuit outputting voltages (VPP+/VPP−) higher than a fixed value, and provided to the Class-H driver.

Moreover, based on actual application, the signal processing method of the signal processing system of the present invention also comprises a step of delaying input signals; wherein, the first delay circuit and the second delay circuit respectively and simultaneously delay the left sound L-in and right sound R-in for a duration longer than a delay duration of the output voltage (VPP+/VPP−) from the outputted end of the power source generation circuit caused by signal processing of the VU meter module and the power source generation circuit to ensure the Class-H driver already has the output voltage (VPP+/VPP−) from the outputted end of the power source generation circuit when the left sound L-in and right sound R-in arrive at the Class-H driver; in other words, obtaining the demand message before the loading demand occurring.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

Figure 1:
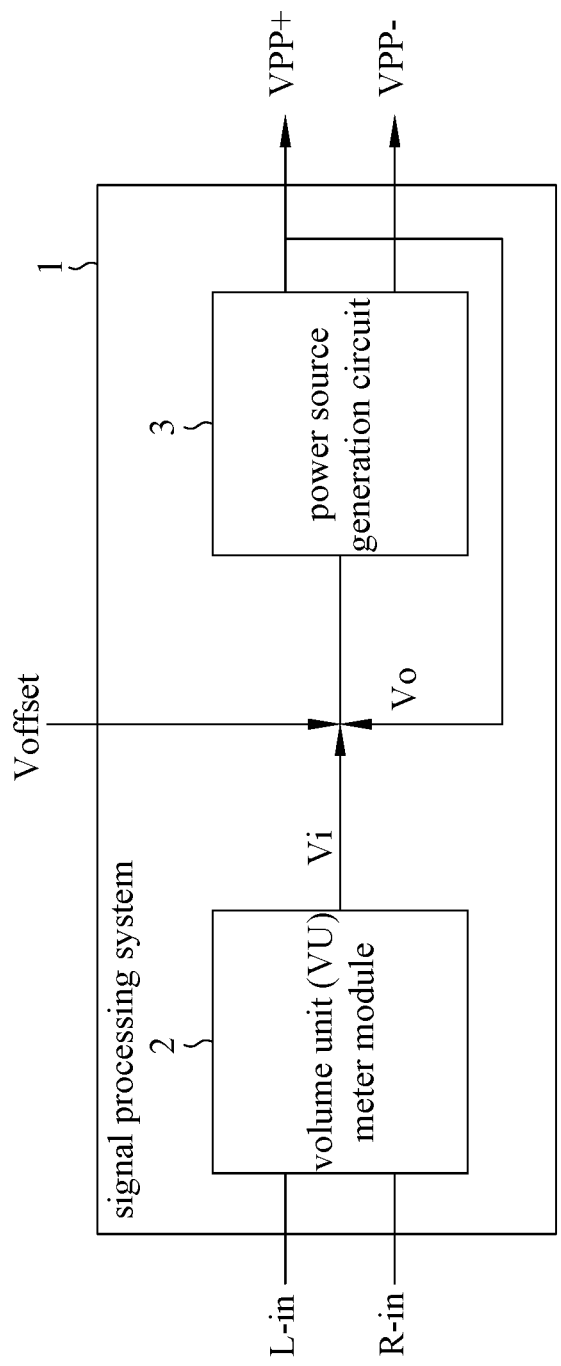
FIG. 1 shows a schematic view of the signal processing system and related operation in accordance with an exemplary embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 shows a schematic view of the signal processing system and related operation in accordance with an exemplary embodiment. As shown in FIG. 1, the signal processing system 1 comprises at least: a volume unit (VU) meter module 2, and a power source generation circuit 3.

VU meter module 2: the UV meter module detects volume changes in a left sound L-in and a right sound R-in, and uses detection results as an expected value for the power source generation circuit 3.

Power source generation circuit 3: the power source generation circuit 3 is a negative feedback circuit, and has input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputs voltages (positive voltage VPP+ and negative voltage VPP−) higher than a fixed value, and provided to the Class-H driver (not shown).

Moreover, based on actual application, the signal processing system 1 of the present invention can operate with a first delay module (not shown) and a second delay module (not shown); wherein, the first delay module receives the left sound L-in and the second delay module receives the right sound R-in; the first delay module is a first delay circuit for the left sound L-in, and the second delay module is a second delay circuit for the right sound R-in; the first delay circuit and the second delay circuit respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver already has the output voltage (VPP+/VPP−) from the outputted end of the power source generation circuit 3 when the left sound L-in and right sound R-in arrive at the Class-H driver; in other words, obtaining the demand message before the loading demand occurring.

Figure 2:
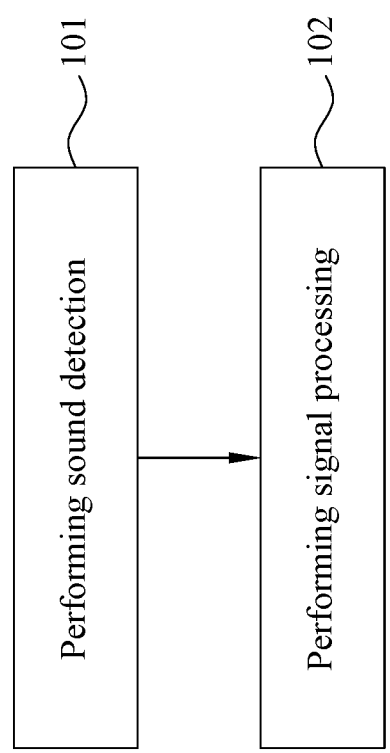
FIG. 2 shows a flowchart of the signal processing method used in the signal processing system in FIG. 1.

FIG. 2 shows a flowchart of the signal processing method used in the signal processing system in FIG. 1.

As shown in FIG. 2, step 101 is to perform sound detection; by using the VU meter module 2 to detect volume changes in the left sound L-in and the right sound R-in, and using detection results as an expected value Vi for the power source generation circuit 3, and proceeding to step 102.

Step 102 is to perform signal processing: using the power source generation circuit 3 as a negative feedback circuit, and having input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputting voltages (VPP+/VPP−) higher than a fixed value, and provided to the Class-H driver.

Moreover, based on actual application, the signal processing method of the signal processing system of the present invention also comprises a step of delaying input signals; wherein, the first delay circuit and the second delay circuit respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver already has the output voltage (VPP+/VPP−) from the outputted end of the power source generation circuit 3 when the left sound L-in and right sound R-in arrive at the Class-H driver; in other words, obtaining the demand message before the loading demand occurring.

Figure 3:
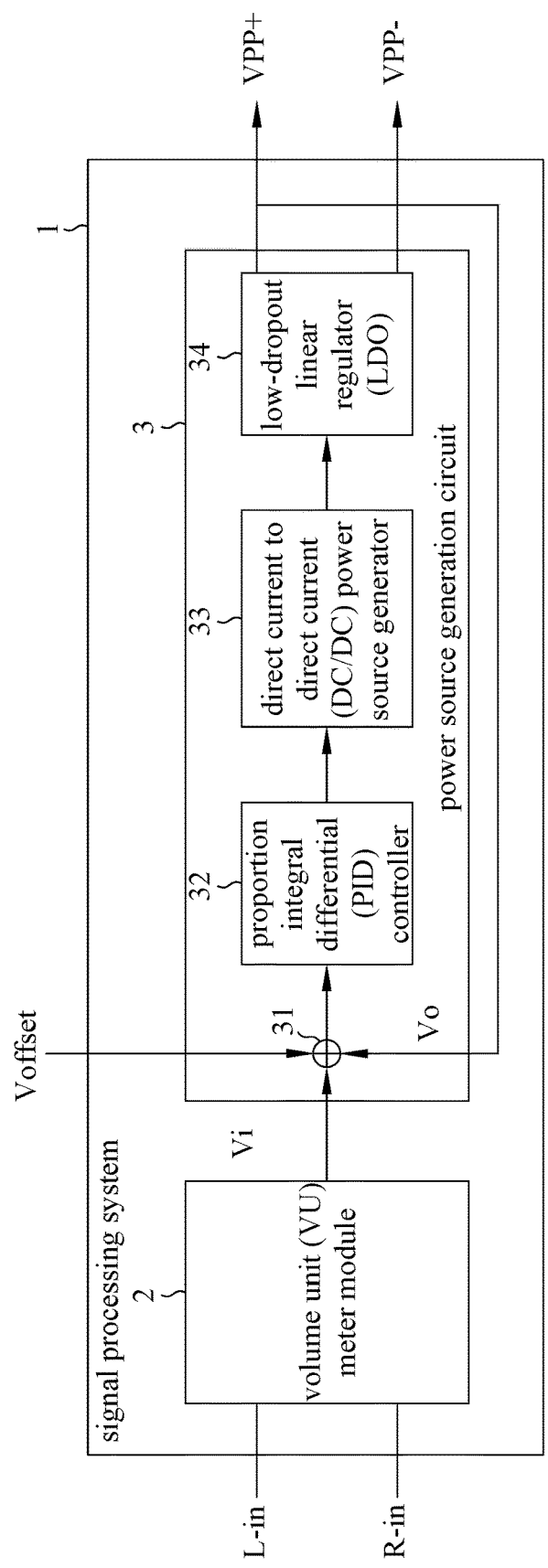
FIG. 3 shows a schematic view of an embodiment of the signal processing system and related operation of the present invention.

FIG. 3 shows a schematic view of an embodiment of the signal processing system and related operation of the present invention. As shown in FIG. 3, the signal processing system 1 comprises at least: a volume unit (VU) meter module 2, and a power source generation circuit 3; wherein, the power source generation circuit 3 further comprising: a signal processing mechanism 31, a proportion integral differential (PID) controller 32, a direct current to direct current (DC/DC) power source generator 33, and a low-dropout linear regulator (LDO) 34.

VU meter module 2: the UV meter module detects volume changes in a left sound L-in and a right sound R-in, and uses detection results as an expected value for the power source generation circuit 3.

Power source generation circuit 3: the power source generation circuit 3 is a negative feedback circuit, and has input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputs voltages (positive voltage VPP+ and negative voltage VPP−) higher than a fixed value, and provided to the Class-H driver (not shown).

Accordingly, the power source generation circuit 3 is a negative feedback circuit, and is formed by the signal processing mechanism 31, the PID controller 32, the DC/DC power source generator 33, and an LDO linear regulator 34.

Signal processing mechanism 31: the signal processing mechanism 31 performs processing on the inputted expected value Vi, voltage offset Voffset, and feedback voltage Vo, wherein the voltage offset Voffset is added to make the feedback voltage Vo from the output end of the power source generation circuit 3 higher than required by the expected value Vi, i.e., the voltage offset Voffset is added to make the voltage output higher than required by the Class-H driver.

Figure 4:
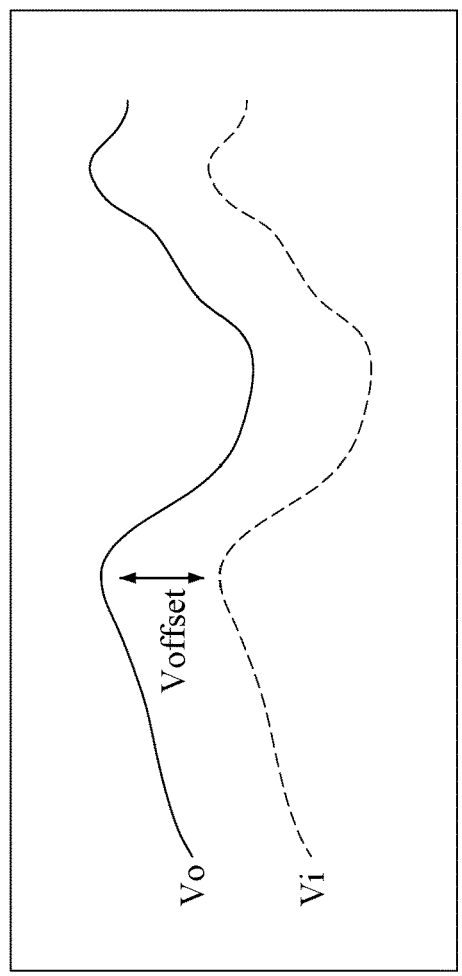
FIG. 4 shows a schematic view of the relation between the feedback voltage and expected value in the present invention.

As shown in FIG. 4, the feedback voltage Vo is always higher than the expected value Vi, and the reason is to make the positive voltage VPP+ and negative voltage VPP− outputted from the power source generation circuit and inputted to the Class-H driver higher than a fixed value.

PID controller 32: the PID controller 32 is added to the negative feedback circuit to improve the response and stability of the negative feedback.

DC/DC power source generator 33: the power source generation circuit 3 uses the power source generator 33 to generate the positive voltage VPP+ and negative voltage VPP− required by the Class-H driver, and output the positive voltage VPP+ and negative voltage VPP− to the LDO linear regulator 34.

LDO linear regulator 34: the LDO linear regulator 34 receives the positive voltage VPP+ and negative voltage VPP− outputted by the DC/DC power source generator 33, and performs improving purity of the power source and then feeding feedback voltage Vo to the signal processing mechanism 31 as well as providing the positive voltage VPP+ and negative voltage VPP− to the Class-H driver.

Moreover, based on actual application, the signal processing system 1 of the present invention can operate with a first delay module (not shown) and a second delay module (not shown); wherein, the first delay module receives the left sound L-in and the second delay module receives the right sound R-in; the first delay module is a first delay circuit for the left sound L-in, and the second delay module is a second delay circuit for the right sound R-in; the first delay circuit and the second delay circuit respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver already has the output voltage (VPP+/VPP−) from the outputted end of the power source generation circuit 3 when the left sound L-in and right sound R-in arrive at the Class-H driver; in other words, obtaining the demand message before the loading demand occurring.

FIG. 4 shows a schematic view of the relation between the feedback voltage and expected value in the present invention. As shown in FIG. 4, the feedback voltage Vo is always higher than the expected value Vi, and the reason is to make the positive voltage VPP+ and negative voltage VPP− outputted from the power source generation circuit and inputted to the Class-H driver higher than a fixed value.

Figure 5:
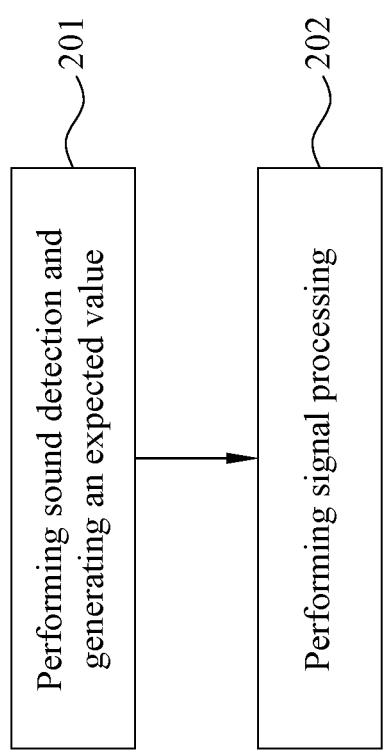
FIG. 5 shows a flowchart of an embodiment of the signal processing method used by the embodiment of the signal processing system of FIG. 3 according to the present invention.

FIG. 5 shows a flowchart of an embodiment of the signal processing method used by the embodiment of the signal processing system of FIG. 3 according to the present invention. As shown in FIG. 5, step 201 is to perform sound detection; by using the VU meter module 2 to detect volume changes in the left sound L-in and the right sound R-in, and using detection results as an expected value Vi for the power source generation circuit 3, and proceeding to step 202.

Step 202 is to perform signal processing: using the power source generation circuit 3 as a negative feedback circuit, and having input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputting voltages (VPP+/VPP−) higher than a fixed value, and provided to the Class-H driver.

Moreover, based on actual application, the signal processing method of the signal processing system of the present invention also comprises a step of delaying input signals; wherein, the first delay circuit and the second delay circuit respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver already has the output voltage (VPP+/VPP−) from the outputted end of the power source generation circuit 3 when the left sound L-in and right sound R-in arrive at the Class-H driver; in other words, obtaining the demand message before the loading demand occurring.

Figure 6:
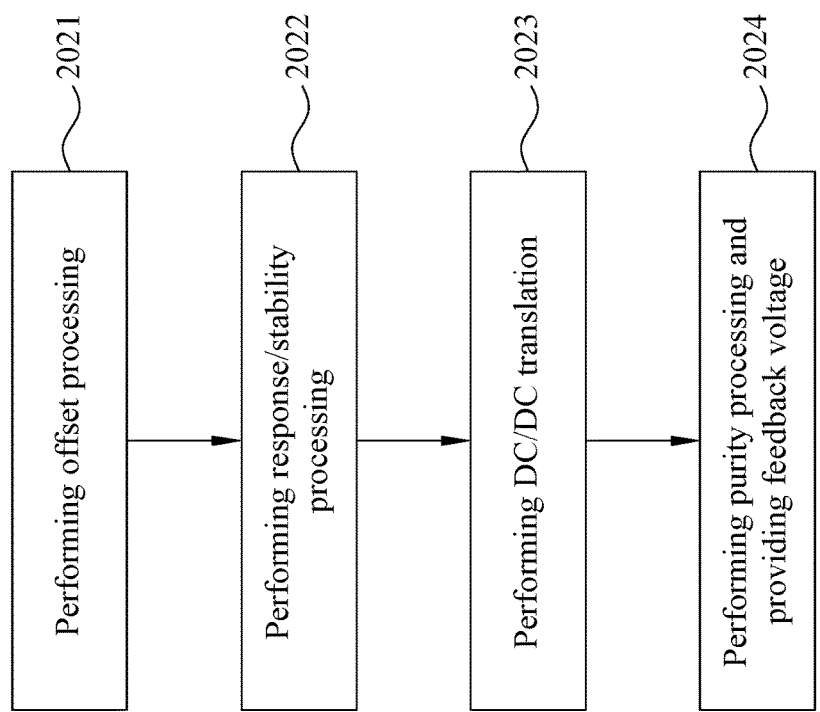
FIG. 6 shows a flowchart of detailed steps of performing signal processing of the signal processing method of FIG. 5.

FIG. 6 shows a flowchart of detailed steps of performing signal processing of the signal processing method of FIG. 5.

As shown in FIG. 6, step 2021 is to perform offset processing: the signal processing mechanism 31 performs processing on the inputted expected value Vi, voltage offset Voffset, and feedback voltage Vo, wherein the voltage offset Voffset is added to make the feedback voltage Vo from the output end of the power source generation circuit 3 higher than required by the expected value Vi, and proceeds to step 2022.

Step 2022 is to perform response/stability processing: the PID controller 32 is added to the negative feedback circuit to improve the response and stability of the negative feedback, and proceeds to step 2023.

Step 2023 is to perform DC to DC translation: the power source generation circuit 3 uses the power source generator 33 to generate the positive voltage VPP+ and negative voltage VPP− required by the Class-H driver, and output the positive voltage VPP+ and negative voltage VPP− to the LDO linear regulator 34, and proceeds to step 2024.

Step 2024 is to perform improving purity: the LDO linear regulator 34 receives the positive voltage VPP+ and negative voltage VPP− outputted by the DC/DC power source generator 33, and performs improving purity of the power source and then feeding feedback voltage Vo to the signal processing mechanism 31 as well as providing the positive voltage VPP+ and negative voltage VPP− to the Class-H driver.

Figure 7:
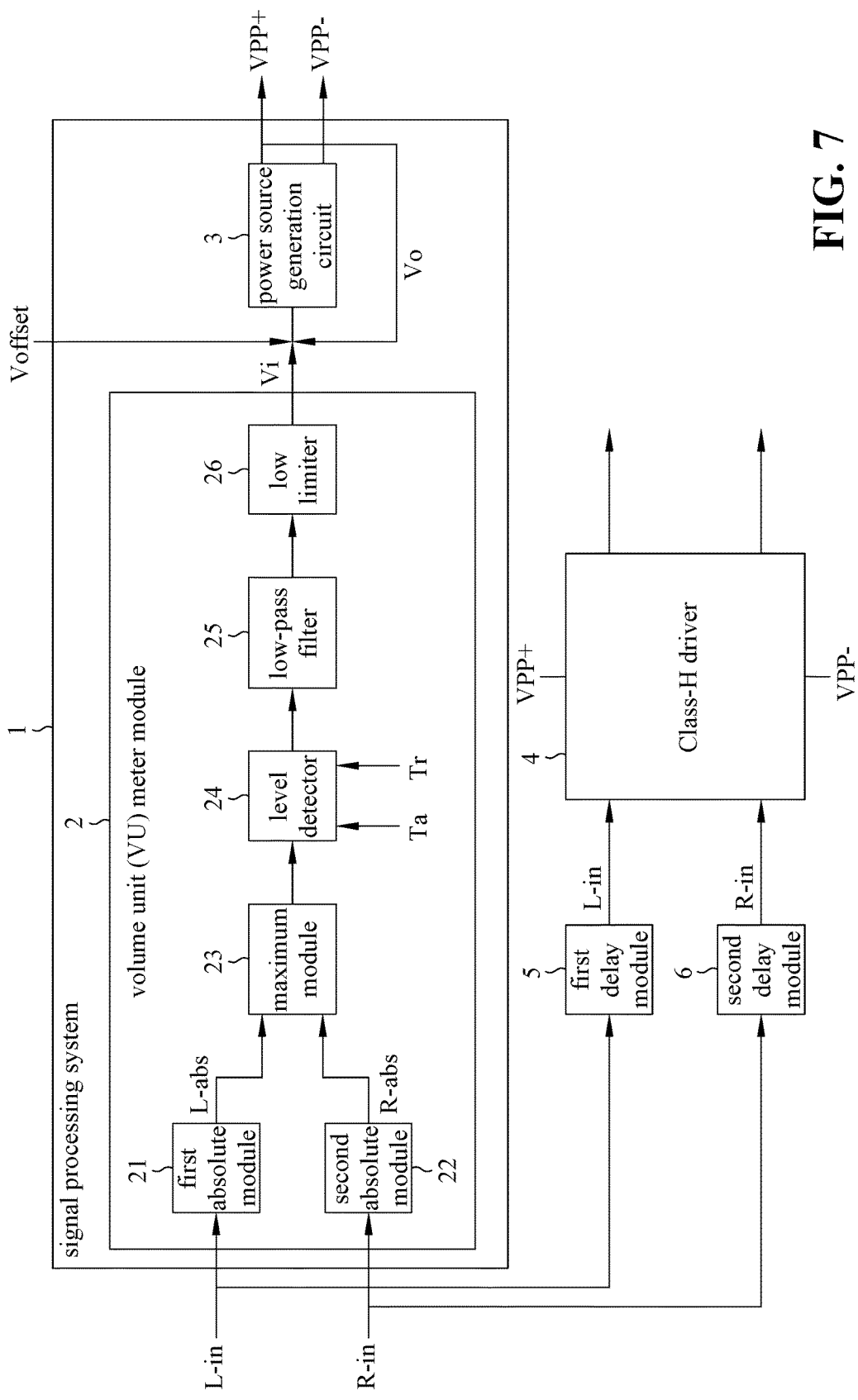
FIG. 7 shows a schematic view of another embodiment of the signal processing system and related operation of the present invention.

FIG. 7 shows a schematic view of another embodiment of the signal processing system and related operation of the present invention. As shown in FIG. 7, the signal processing system 1 comprises at least: a volume unit (VU) meter module 2, and a power source generation circuit 3; wherein the VU meter module 2 comprising a first absolute module 21, a second absolute module 22, a maximum module 23, a level detector 24, a low-pass filter 25, and a low limiter 26; the signal processing system 1 can operate in combination with a first delay module 5 and a second delay module 6.

VU meter module 2: the UV meter module detects volume changes in a left sound L-in and a right sound R-in, and uses detection results as an expected value for the power source generation circuit 3; wherein the VU meter module 2 uses an envelope circuit with different attach rates Ta and release rates Tr to detect the demands of the input signal.

Accordingly, the VU meter module 2 comprises: a first absolute module 21, a second absolute module 22, a maximum module 23, a level detector 24, a low-pass filter 25, and a low limiter 26; the signal processing system 1 can operate in combination with a first delay module 5 and a second delay module 6.

First absolute module 21: the first absolute module 21 obtains a left input signal absolute value L-abs from the left sound L-in, and outputs the left input signal absolute value L-abs to the maximum module 23.

Second absolute module 22: the second absolute module 22 obtains a right input signal absolute value R-abs from the right sound R-in, and outputs the right input signal absolute value R-abs to the maximum module 23.

Maximum module 23: the maximum module 23 selects a maximum sound from the left input signal absolute value L-abs and the right input signal absolute value R-abs, and transmits the maximum sound to the level detector 24.

Level detector 24: the level detector 24 uses different speeds for level detector for rising value and falling value; the level detector 24 performs rising and falling speed processing on input signal, and the attach amount increases while the attack rate Ta decreases; when the signal becomes smaller, the response slows down and the release rate Tr increases; i.e., when the signal becomes larger, the response is faster; when the signal becomes smaller, the response is slower; the level detector 24 transmits the processed level signal to the low-pass filter 25.

Low-pass filter 25: the low-pass filter 25 filters out high frequency variation from the level signal, and transmits the processed low-pass signal to the lower limiter 26.

Lower limiter 26: the lower limiter 26 performs low level detection on the low-pass signal, when lower than a lower limit, the signal is not further lowered; because the voltage input to the Class-H driver must have a minimum value that is not 0V, the lower limiter 26 can output the expected value Vi to the power source generation circuit 3.

Power source generation circuit 3: the power source generation circuit 3 is a negative feedback circuit, and has input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputs voltages (positive voltage VPP+ and negative voltage VPP−) higher than a fixed value, and provided to the Class-H driver 4.

First delay module 5 and second delay module 6: the first delay module 5 receives the left sound L-in and the second delay module 6 receives the right sound R-in; the first delay module 5 is a first delay circuit for the left sound L-in, and the second delay module 6 is a second delay circuit for the right sound R-in; the first delay circuit and the second delay circuit respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver 4 already has the output voltage (VPP+/VPP−) from the outputted end of the power source generation circuit 3 when the left sound L-in and right sound R-in arrive at the Class-H driver 4; in other words, obtaining the demand message before the loading demand occurring.

Figure 8:
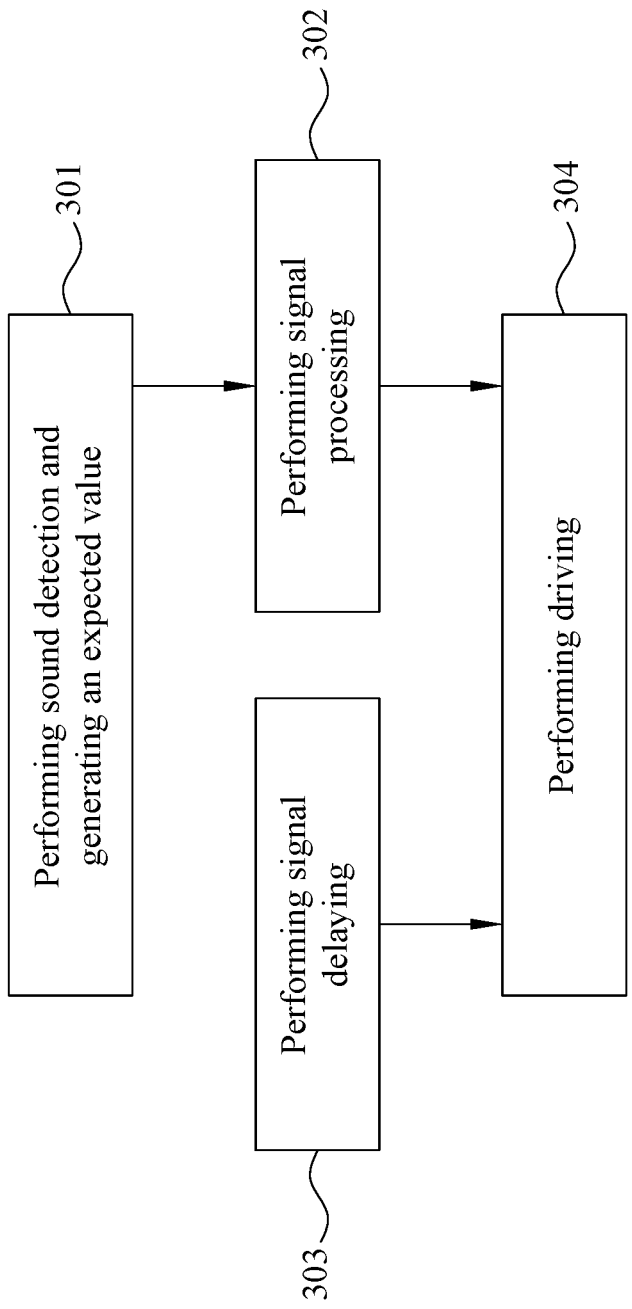
FIG. 8 shows a flowchart of an embodiment of the signal processing method used by the embodiment of the signal processing system of FIG. 7 according to the present invention.

FIG. 8 shows a flowchart of an embodiment of the signal processing method used by the embodiment of the signal processing system of FIG. 7 according to the present invention.

As shown in FIG. 8, step 301 is to perform sound detection: by using the VU meter module 2 to detect volume changes in the left sound L-in and the right sound R-in, and using detection results as an expected value Vi for the power source generation circuit 3, and proceeding to step 302.

Step 302 is to perform signal processing: using the power source generation circuit 3 as a negative feedback circuit, and having input ends for receiving the expected value Vi outputted from the VU meter module 2, a voltage offset Voffset, and a feedback voltage Vo outputted from an output end of the power source generation circuit 3 to perform voltage negative feedback processing, the output end of the power source generation circuit 3 outputting voltages (VPP+/VPP−) higher than a fixed value, and provided to the Class-H driver, and proceeding to step 304.

Step 303 is to perform input signal delay: the first delay circuit 5 and the second delay circuit 6 respectively and simultaneously delay the left sound L-in and right sound R-in for a duration longer than a delay duration of the output voltage (VPP+/VPP−) from the outputted end of the power source generation circuit 3 caused by signal processing of the VU meter module 2 and the power source generation circuit 3 to ensure the Class-H driver 4 already has the output voltage (VPP+/VPP−) from the outputted end of the power source generation circuit 3 when the left sound L-in and right sound R-in arrive at the Class-H driver 4; and proceeding to step 304.

Step 304 is to perform driving: the Class-H driver 4 first receives the output voltage (VPP+/VPP−) from the outputted end of the power source generation circuit 3, and then receives the delayed input signal left sound L-in and right sound R-in outputted from the first delay circuit 5 and the second delay circuit 6 so as to automatically adjust voltage supply according to the signal value of the left sound L-in and the right sound R-in.

Figure 9:
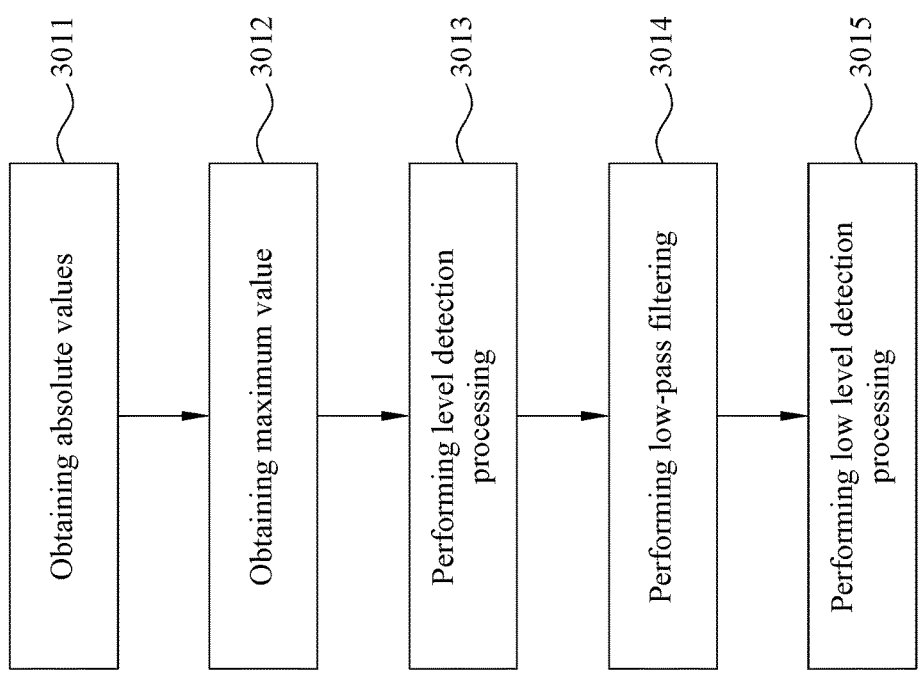
FIG. 9 shows a flowchart of detailed steps of performing signal processing of the signal processing method of FIG. 7.

FIG. 9 shows a flowchart of detailed steps of performing signal processing of the signal processing method of FIG. 7.

As shown in FIG. 9, step 3011 is to perform obtaining absolute values of sounds: the first absolute module 21 obtains a left input signal absolute value L-abs from the left sound L-in, and outputs the left input signal absolute value L-abs to the maximum module 23; and, the second absolute module 22 obtains a right input signal absolute value R-abs from the right sound R-in, and outputs the right input signal absolute value R-abs to the maximum module 23, and then proceeds to step 3012.

Step 3012 is to perform obtaining maximum value: the maximum module 23 selects a maximum sound from the left input signal absolute value L-abs and the right input signal absolute value R-abs, and transmits the maximum sound to the level detector 24, and proceeds to step 3013.

Step 3013 is to perform level detection processing: the level detector 24 uses different speeds for level detector for rising value and falling value; the level detector 24 performs rising and falling speed processing on input signal, and the attach amount increases while the attack rate Ta decreases; when the signal becomes smaller, the response slows down and the release rate Tr increases; i.e., when the signal becomes larger, the response is faster; when the signal becomes smaller, the response is slower; the level detector 24 transmits the processed level signal to the low-pass filter 25, and proceeds to step 3014.

Step 3014 is to perform low-pass filtering: the low-pass filter 25 filters out high frequency variation from the level signal, and transmits the processed low-pass signal to the lower limiter 26, and proceeds to step 3015.

Step 3015 is to perform low level detection processing: the lower limiter 26 performs low level detection on the low-pass signal, when lower than a lower limit, the signal is not further lowered; because the voltage input to the Class-H driver must have a minimum value that is not 0V, the lower limiter 26 can output the expected value Vi to the power source generation circuit 3 for subsequent processing.

The VU meter module 2 and the power source generation circuit 3 in the embodiment of the signal processing system in FIG. 3 and the embodiment in FIG. 8 can be implemented in other equivalent circuits, and the detailed description will not be repeated here.

In summary, the signal processing system and method thereof according to the present invention is applicable to environment providing voltage to Class-H driver. When using the signal processing system, the first is to detect the volume change of inputted voice and use the detection result as a power source to generate an expectation value for the circuit; the input end of the power generation circuit also adds a voltage offset (Voffset) in addition to the expectation value, so that the output voltage from the output end of the power generator provided to the Class-H driver is higher than a fixed value. The signal processing system and method of the present invention can adjust automatically and rapidly the output voltage signal for the power voltage provided to the Class-H driver by using negative feedback controller (such as, negative feedback loop, voltage offset and proportional integral differential (PID)) based on the detected volume change of inputted voice. The present invention provides the following advantages:

1. based on the detected volume change of inputted voice, able to adjust automatically and rapidly the output voltage signal for the power voltage provided to the Class-H driver by using negative feedback controller, able to obtain demand message before loading demand occurring;

2. able to adjust automatically and rapidly the output voltage signal for the power voltage provided to the Class-H driver by using negative feedback controller, voltage offset, and proportion integral differential (PID) controller;

3. able to use envelope circuit with different attach rates and release rates to detect the demand of inputted signal;

4. able to adjust automatically and rapidly the output voltage signal for the power voltage provided to the Class-H driver by using negative feedback controller, and proportion integral differential (PID) controller, able to add an offset in the feedback loop to control a safe offset of voltage supply output and the demand, able to use direct current to direct current (DC/DC) power generator in combination with a low dropout linear regulator (LDO) to provide a high quality power driver to the Class-H driver; and 5. providing a power source circuit design for Class-H driver so that an instantaneous surge in loading output will not lead to belated voltage supply, as well as free of the unstable voltage supply in case of the drastic loading change when using current loading detection as a basis for voltage adjustment.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A signal processing method, applicable to an environment of providing an output voltage to a Class-H driver, comprising the following steps:
    performing sound detection: detecting volume changes in a left sound and a right sound of an input signal, and using detection results as an expected value; and
    performing signal processing: receiving the expected value, a voltage offset, and a feedback voltage to perform voltage negative feedback processing to obtain an output voltage higher than a fixed value, and providing the output voltage to the Class-H driver so that the Class-H driver is able to adjust voltage supply according to the output voltage;
    wherein the left sound and the right sound of the input signal inputted to the Class-H driver are delayed and when the left sound and the right sound of the input signal arrive at the Class-H driver, the output voltage is already inputted to the Class-H driver.

2. The signal processing method as claimed in claim 1, wherein the performing sound detection step further comprises:

obtaining absolute values of input sounds: obtaining a left input signal absolute value from the left sound and obtaining a right input signal absolute value from the right sound;

obtaining maximum value: selecting a maximum sound from the left input signal absolute value and the right input signal absolute value;

performing level detection processing: performing level detection using different speeds for rising value and falling value; performing different rising and falling speed processing on the selected maximum sound; and transmitting a processed level signal;

performing low-pass filtering: filtering out high frequency variation from the level signal, and transmitting a processed low-pass signal; and performing low level detection processing: performing low level detection on the low-pass signal, and generating an expected value for subsequent processing.

3. The signal processing method as claimed in claim 1, wherein the step of performing signal processing further comprises:

performing offset processing: receiving the expected value, the voltage offset, and the feedback voltage, and performing negative feedback processing on the expected value, the voltage offset, and the feedback voltage;

performing response/stability processing: improving the response and stability of the negative feedback processing;

performing direct current to direct current (DC/DC) translation: generating a positive voltage and a negative voltage of the output voltage required by the Class-H driver; and performing improving purity: receiving the positive voltage and negative voltage of the output voltage, purity of a power source, providing the feedback voltage for performing voltage negative feedback processing, and providing the positive voltage and negative voltage of the output voltage to the Class-H driver, so that the Class-H driver is able to adjust voltage supply according to the positive voltage and negative voltage of the output voltage.

4. The signal processing method as claimed in claim 3, wherein the left sound and the right sound of the input signal inputted to the Class-H driver are delayed; and when the left sound and the right sound of the input signal arrive at the Class-H driver, the positive voltage and negative voltage of the output voltage are already inputted to the Class-H driver.

5. A signal processing system, applicable to an environment of providing an output voltage to a Class-H driver, comprising:

a volume unit (VU) meter module, for detecting volume changes in a left sound and a right sound, and using detection results as an expected value; and a power source generation circuit, being a negative feedback circuit, having input ends for receiving the expected value outputted from the VU meter module, a voltage offset, and a feedback voltage outputted from an output end of the power source generation circuit to perform voltage negative feedback processing, the output end of the power source generation circuit outputting voltages higher than a fixed value to provide to the Class-H driver so that the Class-H driver is able to adjust voltage supply according to the positive voltage and negative voltage of the output voltage.

6. The signal processing system as claimed in claim 5, operating with a first delay circuit and a second delay circuit; wherein, the first delay circuit and the second delay circuit respectively and simultaneously delay the left sound and right sound for a duration so that when the left sound and right sound arrive at the Class-H driver, the output voltage is already inputted to the Class-H driver.

\* \* \* \* \*